(12) United States Patent
Miyagawa et al.

(10) Patent No.: US 6,677,788 B2
(45) Date of Patent: Jan. 13, 2004

(54) SEMICONDUCTOR INTEGRATED CIRCUIT

(75) Inventors: Hirokazu Miyagawa, Takasaki (JP);
Katsumi Yamamoto, Kokubunji (JP);
Tatsuji Matsuura, Tokyo (JP);
Katsumi Osaki, Takasaki (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/256,149

(22) Filed: Sep. 27, 2002

(65) Prior Publication Data
US 2003/0076139 A1 Apr. 24, 2003

(30) Foreign Application Priority Data

Oct. 18, 2001 (JP) ........................................ 2001-320677

(51) Int. Cl.[7] ................................................. H03L 7/06
(52) U.S. Cl. ........................ 327/156; 375/376; 327/512
(58) Field of Search ................................. 327/156, 157, 327/512, 513; 375/375, 376

(56) References Cited

U.S. PATENT DOCUMENTS 6,342,798 B1 * 1/2002 Yoshida ...................... 327/156

FOREIGN PATENT DOCUMENTS

JP            07106960 A   *  4/1995   ............. H03L/7/14

* cited by examiner

Primary Examiner—Terry D. Cunningham
Assistant Examiner—Quan Tra
(74) Attorney, Agent, or Firm—Miles & Stockbridge P.C.

(57) ABSTRACT

The present invention is directed to reduce fluctuations in modulation frequency of a VCO caused by a temperature change in a semiconductor integrated circuit for use in a radio communication system of a frequency hopping method performing modulation by controlling the VCO of an LC oscillation type in accordance with transmission data in an open loop by using the VCO. In a semiconductor integrated circuit of a frequency hopping method performing modulation by directly controlling an LC oscillation type VCO on the basis of transmission data and transmitting data while switching a carrier frequency, a temperature characteristic correcting circuit is provided which give a negative temperature characteristic to a reference current value of a circuit (such as a DA converter) for generating a control voltage of the VCO so that a modulation-side control input voltage having a positive temperature characteristic and controlling the VCO comes to have a negative temperature characteristic.

11 Claims, 13 Drawing Sheets

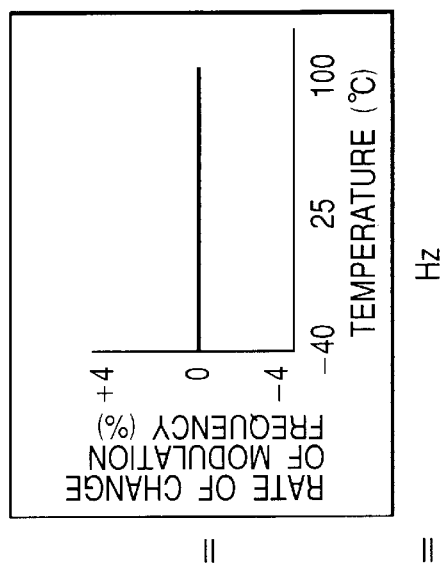
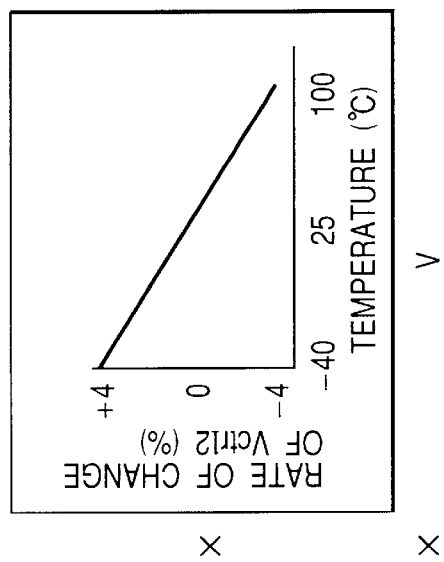
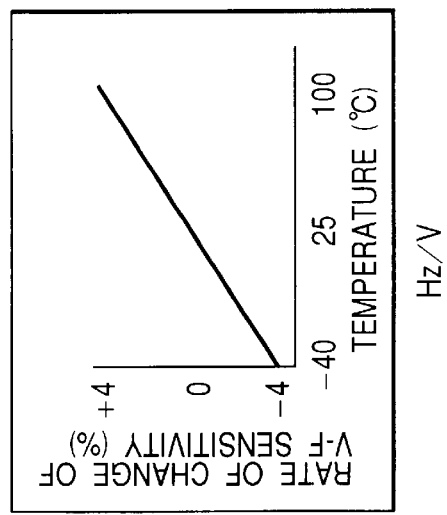

SEMICONDUCTOR INTEGRATED CIRCUIT

BACKGROUND OF THE INVENTION

The present invention relates to a technique effectively applied to a semiconductor integrated circuit (RF module) for modulation which is used in a transmission system of a radio communication system employing frequency hopping for performing frequency modulation by controlling an LC oscillation type VCO (Voltage Controlled Oscillator) on the basis of transmission data while generating a carrier frequency signal by the LC oscillation type VCO and performing data transmission while hopping a carrier frequency. More particularly, the invention relates to a temperature compensating technique for an oscillation frequency of a VCO in a modulating operation performed in an open PLL loop which generates a carrier frequency.

In data communications in which signals of various communication systems are transmitted in association with development in radio communication, there is the possibility that accurate data transmission cannot be guaranteed due to interference of signals or fading. There is consequently a radio communication system preventing interference of signals in neighboring frequency bands by varying carrier frequency signals. For example, in the standard called Bluetooth defining specifications regarding data transmission by radio communication among peripheral devices such as a personal computer and a printer, as a transmission system, as shown in FIG. 13, spread spectrum realized by frequency hopping of every MHz in the frequency band of 2.4 GHz to 2.48 GHz (hereinbelow, called a 2.4 GHz band) is employed to prevent interference of signals in neighboring frequency bands. The Bluetooth standard employs a frequency modulating method of transmitting data while modulating a carrier frequency signal in the 2.4 GHz band with ±160 kHz.

In the case of performing such frequency modulation, a method of controlling the frequency by directly controlling a VCO circuit in accordance with data to be transmitted may be employed. As VCO circuits, a circuit of a type controlling an oscillation frequency by changing a current by a control voltage and a circuit called an LC oscillation type VCO which controls an oscillation frequency by changing a capacitance value of variable capacity by a control voltage are known.

SUMMARY OF THE INVENTION

For example, in the case of modulating a frequency in accordance with transmission data by frequency hopping, there are not only the frequency modulation according to data but also hopping control of a carrier frequency itself, so that two control systems are necessary. The inventors herein have therefore examined the following system in order to develop an LSI (large scale semiconductor integrated circuit) for radio communication employing the radio communication system. According to the examined system (hereinbelow, called an open loop system), an LC oscillator type VCO using a varactor diode as shown in FIG. 2 is used. The frequency is stabilized by a PLL loop while switching the frequency by changing a control voltage Vcnt1 as one of control voltages in accordance with the carrier frequency hopped. At the time of performing modulation, while holding the control of voltage Vcnt1 in a loop filter, the PLL loop is opened, and the oscillation frequency of the VCO is changed with a control voltage Vcnt2 according to transmission data, thereby modulating the carrier frequency signal.

In the case of performing modulation by directly controlling a VCO with transmission data by using the LC oscillation type VCO, in a closed loop system for performing modulation without opening the PLL loop, when a clock which is stable irrespective of changes in temperature is used as a reference clock of which phase is compared with the phase of a feedback oscillation signal from the VCO, even if the capacitance value of the LC oscillation type VCO changes due to a temperature change, the VCO can be oscillated at a desired frequency. However, it became apparent that, in the case of employing the open loop system, a modulation frequency of the VCO largely fluctuates according to a temperature change, and a problem such that a margin is severely narrowed in a permissible range occurs. The open loop system has an advantage that the circuit configuration is simpler and a circuit occupation area can be reduced as compared with the closed loop system.

On the other hand, for example, in the Bluetooth standard, in the case of transmitting a signal obtained by modulating a carrier frequency signal in the 2.4 GHz band with ±160 kHz, it is sufficient to modulate the signal within the range from ±145 to 175 kHz. That is, the margin of ±15 kHz is permitted. As long as the modulation is within the margin, the frequency may fluctuate more or less due to temperature change. However, when the margin of the frequency is narrowed due to a temperature change, the strain is shifted to designing of other circuits, and it becomes very difficult to design a transmitting circuit having characteristics satisfying the standard.

For example, in the case of performing modulation with the same amplitude in accordance with transmission data, in other words, in the case of controlling an oscillation frequency with a fixed amplitude of a control voltage Vcnt2 irrespective of the carrier frequency in the VCO in FIG. 2, when the frequency is switched by the other control voltage Vcnt1 for frequency hopping, not only the capacitance of varactor diodes Dv11 and Dv12 but also a composite capacitance of the varactor diodes Dv11 and Dv12 and other varactor diodes Dv21 and Dv22 change and the frequency changes. It makes the modulation gain of the VCO change and the modulation frequency may shift according to the carrier frequency. Therefore, it is desirable to suppress fluctuations in frequency in association with the temperature change as much as possible.

It became apparent that the frequency fluctuates due to the temperature change for the following reason. In the LC oscillator type VCO as shown in FIG. 2, when a composite capacitance of capacitors C11 and C12 and the varactor diodes Dv11 and Dv12 is C1 and a composite capacitance of capacitors C21 and C22 and the varactor diodes Dv21 and Dv22 is C2, characteristics with respect to voltage of the composite capacitances C1 and C2 are as shown in FIG. 4A. It is understood from FIG. 4A that the capacitance value of each of the composite capacitances C1 and C2 increases as the temperature rises.

In this case, an oscillation frequency fosc of the VCO is expressed as $fosc=1/\{2\pi\sqrt{(C1+C2)}\}$. From the expression, it is understood that when the capacitance values of the composite capacitances C1 and C2 increase as the temperature rises, the oscillation frequency fosc of the VCO decreases. The frequency characteristics with respect to the control voltage Vcnt1 of the VCO were examined and it was found that the frequency characteristics are as shown in FIG. 4B. Specifically, it is understood from FIG. 4B that as the temperature rises, a change in frequency increases, and the gradient of a tangent line of a curve between the upper and lower limits in the control voltage range, that is, the variation in the voltage-frequency control sensitivity of the VCO also increases. In a communication system of the Bluetooth standard of hopping the frequency in the range from 2.402 GHz to 2.480 GHz, the oscillation frequency of the VCO is 2.480 GHz at the maximum and is 2.402 GHz at the minimum, and the difference between the maximum and minimum frequencies is very large. Consequently, it is considered that the variation in the voltage-frequency control sensitivity of the VCO is also large.

An object of the invention is, therefore, to reduce fluctuations in modulation frequency of a VCO in association with a temperature change in a semiconductor integrated circuit for modulation for use in a frequency hopping type radio communication system which modulates a frequency by controlling a VCO circuit in accordance with transmission data in an open loop method by using an LC oscillation type VCO circuit.

Another object of the invention is to provide a semiconductor integrated circuit for modulation which can serve as a component of a radio communication system capable of performing accurate data transmission with little crosstalk.

The above and other objects and novel features of the present invention will become apparent from the description of the specification and the appended drawings.

The outline of representative ones of inventions disclosed in the application will be described as follows.

In a semiconductor integrated circuit for modulation which performs frequency modulation by controlling an LC oscillation type VCO on the basis of transmission data while generating a carrier frequency signal by the LC oscillation type VCO and performs data transmission while hopping a carrier frequency, a temperature characteristic correcting circuit for making a modulation-side control input voltage (Vcnt2) for controlling the VCO have a negative temperature characteristic by giving a negative temperature characteristic to a reference current value of a circuit (for example, a DA converter) for generating a control voltage of the VCO is provided.

With the means, even when the VCO has a positive temperature characteristic, a voltage controlling the VCO is allowed to have a negative temperature characteristic. Consequently, a temperature-compensated oscillation frequency having no temperature dependency is obtained. Thus, the frequency margin can be increased and the circuit designing is facilitated. In the case of applying the semiconductor integrated circuit for modulating having such a configuration to a radio communication system of a frequency hopping method, the precision of the oscillation frequency obtained is increased. Therefore, a radio communication system capable of performing accurate data transmission with little interference can be realized.

The invention is particularly effective to a semiconductor integrated circuit including: a voltage controlled oscillator; a phase comparator for comparing a phase of an oscillation output of the voltage controlled oscillator with a phase of a reference clock signal; and a control voltage generating circuit for generating a voltage which eliminates a phase difference detected by the phase comparator and applying the voltage as a first control voltage to the voltage controlled oscillator. By a phase locked loop constructed by the voltage controlled oscillator, the phase comparator, and the control voltage generating circuit, a carrier frequency is given. A second control voltage for modulation is supplied to the voltage controlled oscillator from a path different from the phase locked loop. When the modulating operation is performed with the second control voltage, the phase locked loop is opened.

When a circuit for generating the second control voltage is constructed by a digital filter for sampling a digital transmission data signal and performing computation and a DA converter for DA converting an output of the digital filter, the temperature characteristic correcting circuit may correct so that a reference current of the DA converter has a negative temperature characteristic. When the circuit has a trimming circuit for adjusting the intensity of the reference current of the DA converter and the trimming circuit is constructed by a second DA converter for DA converting trimming information and supplying, as a reference current, a current according to the trimming information to the DA converter, the temperature characteristic correcting circuit makes correction so that the reference current of the second DA converter for trimming has a negative temperature characteristic.

Further, the temperature characteristic correcting circuit can be constructed by a plurality of first current sources for passing a current having no temperature dependency, a plurality of second current sources for passing a current having a positive temperature characteristic, and selecting means for selecting one or more current sources from the plurality of first current sources and from the plurality of second current sources, and a composite current of the selected current sources can be output as the reference current.

BRIEF DESCRIPTION OF THE DRAWINGS

FIGS. 5A to 5C are graphs showing the principle of temperature compensation in the transmission circuit of the embodiment.

DESCRIPTION OF PREFERRED EMBODIMENTS OF THE INVENTION

Preferred embodiments of the invention will be described hereinbelow with reference to the drawings.

Figure 1:
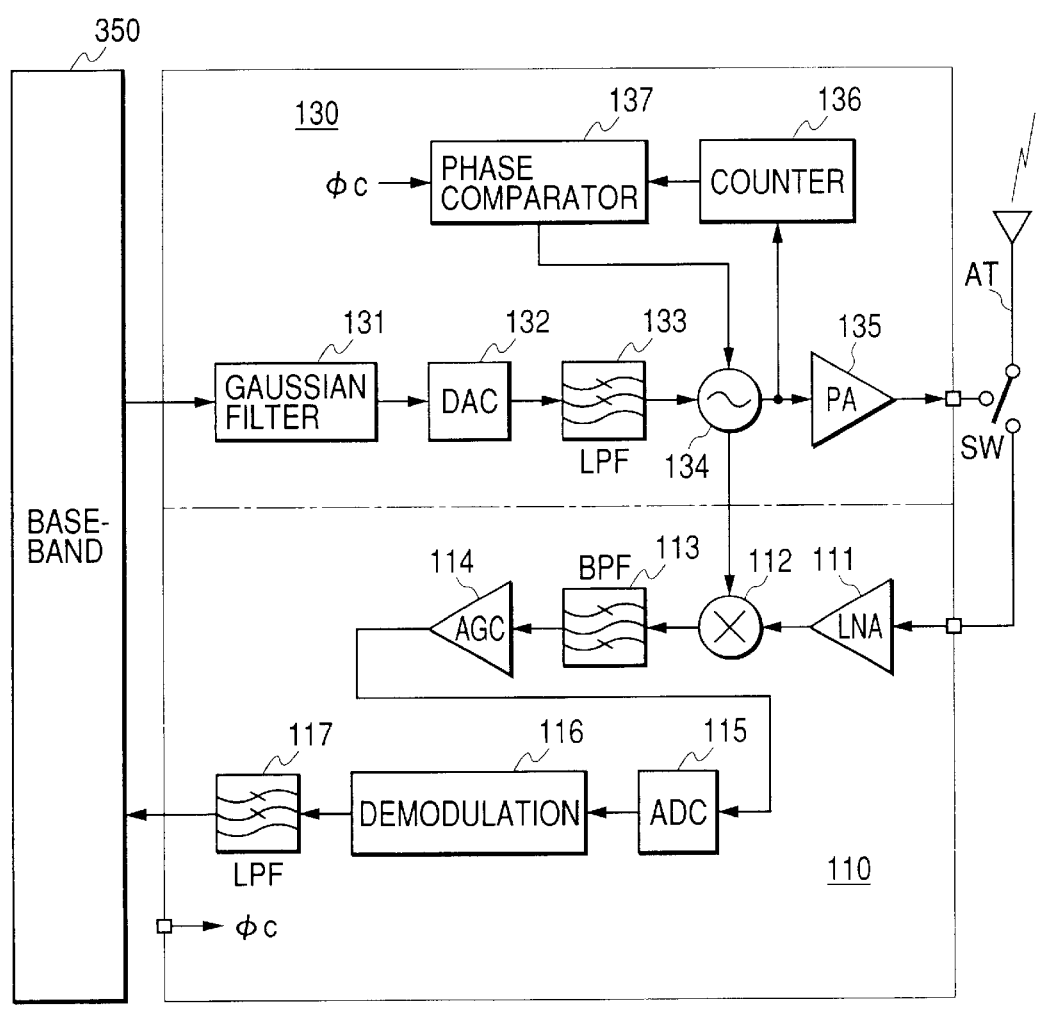
FIG. 1 is a block diagram showing an example of the configuration of a radio communication system to which a semiconductor integrated circuit for modulation according to the invention can be preferably applied.

FIG. 1 shows an example of the configuration of a radio communication system to which a semiconductor integrated circuit for modulation according to the invention is preferably applied.

In FIG. 1, AT denotes an antenna for transmitting/receiving signal waves, SW denotes a switch for switching transmission and reception, 110 indicates a receiving circuit for down-converting a signal received from the antenna AT to an intermediate frequency, demodulating and amplifying the resultant signal, and converting the signal to a baseband signal, and 130 expresses a transmitting circuit for modulating and frequency-converting the baseband signal transmitted from the antenna AT.

The transmitting circuit 130 includes a Gaussian filter 131 for sampling an input rectangular wave signal and generating a code for modulation, a DA converting circuit 132 for DA converting an output of the filter to generate a step waveform signal, a low pass filter 133 for obtaining a signal of a smooth waveform from the generated step waveform signal, a frequency converting circuit 134 taking the form of a voltage controlled oscillator (VCO) whose oscillation frequency is controlled by an output voltage of the low pass filter 133, thereby performing modulation, and a power amplifier 135 for receiving a frequency-converted signal and transmitting a signal wave by driving the antenna AT.

Further, the transmitting circuit 130 of the embodiment includes a counter 136 for dividing the frequency of an output of the VCO 134, and a phase comparator 137 for comparing the phase of an output of the counter 136 with the phase of a reference clock φc such as 13 MHz, generating a voltage according to the phase difference, and controlling the oscillation frequency of the VCO 134. A PLL (Phase Locked Loop) circuit is constructed by the VCO 134, counter 136, and phase comparator 137 and generates a carrier frequency signal. By changing the oscillation frequency of the VCO 134 with an output voltage of the low pass filter 133 in which transmission data is reflected, the carrier frequency signal is modulated.

In the radio communication system of the embodiment, by changing a count value of the counter 136 set in a register provided with the counter 136 by a setting from a baseband circuit 350, data transmission of spread spectrum by so-called frequency hopping can be performed while hopping the carrier frequency every MHz, for example.

In the embodiment, as the Gaussian filter 131, an FIR (Finite Impulse Response) type filter constructed by a shift register for sequentially fetching input data and a sum of products computing unit for multiplying the fetched data with a filter coefficient and sequentially adding the results is used. Although not particularly regulated, an input shift register has seven stages, a filter coefficient consists of 5 bits, and a filter output also consists of 5 bits.

The receiving circuit 110 includes a low noise amplifying circuit (LNA) 111 for amplifying a signal received by the antenna AT, a mixer (MIX) 112 for mixing the amplified reception signal and an oscillation signal from the transmission-side VCO, thereby down-converting the reception signal to a signal of an intermediate frequency (for example, 2 MHz), a bandpass filter 113 for eliminating a leakage signal from a neighboring channel and extracting a signal component of the target channel, a gain-variable programmable gain amplifier (AGC) 114 for amplifying the reception signal to a predetermined amplitude, an AD converting circuit 115 for converting an analog signal to a digital signal, a demodulating circuit 116 for demodulating reception data, and a low pass filter (LPF) 117 for eliminating high frequency components (noise) from the demodulated signal and passing the resultant reception data to the baseband circuit 350.

Figure 2:
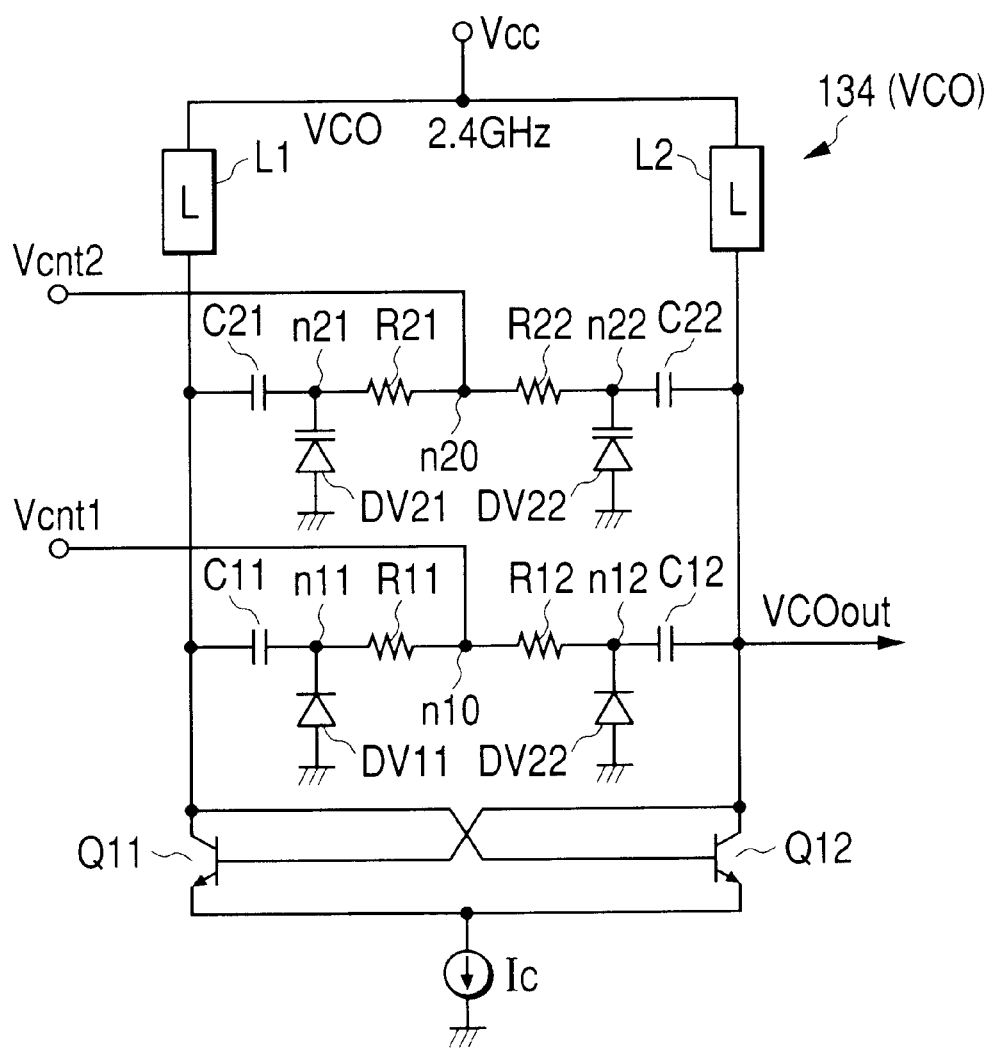
FIG. 2 is a circuit diagram showing an example of an LC oscillation type VCO used in the semiconductor integrated circuit for modulation according to the invention.

FIG. 2 shows an example of an LC oscillation type oscillating circuit used as the VCO 134 as a component of the transmitting circuit 130. The oscillating circuit of the embodiment is constructed by, as shown in FIG. 2, a pair of bipolar transistors Q11 and Q12 having a common emitter and bases and collectors which are cross coupled, a constant current source Ic connected between the common emitter of the transistors Q11 and Q12 and a ground point, inductances L1 and L2 connected between the collectors of the transistors Q11 and Q12 and a power supply voltage terminal Vcc, respectively, a capacitor C11, resistors R11 and R12, and a capacitor C12 which are connected in series between the collector terminals of the transistors Q11 and Q12, a capacitor C21, resistors R21 and R22, and a capacitor C22 connected in parallel with the capacitor C11, resistors R11 and R12, and capacitor C12, and varactor diodes Dv11, Dv12, Dv21, and Dv22 connected between connection nodes n11, n12, n21, and n22 between the capacitors C11, C12, C21, and C22 and the resistors R11, R12, R21, and R22, respectively, and the ground point.

The control voltage Vcnt1 from the phase comparator 137 shown in FIG. 1 is applied to the connection node n10 between the resistors R11 and R12 and a carrier frequency is determined. The control voltage Vcnt2 for frequency modulation from the low pass filter 133 shown in FIG. 1 is applied to the connection node n20 between the resistors R21 and R22 to control the modulation frequency. By generating the stable, accurate carrier frequency signal by the closed PLL circuit and modulating the frequency with the control voltage applied from the outside, as compared with the method of controlling the modulation frequency by supplying a signal for modulation into the loop of the PLL circuit, the circuit configuration is simplified, and the circuit area can be reduced.

At the time of applying the control voltage Vcnt2 for frequency modulation to the VCO 134, a current path from a charge pump 138 to a loop filter 139 is interrupted in a state where the carrier frequency of the PLL circuit is stable to make the immediately preceding control voltage Vcnt1 held in the capacitor of the loop filter 139, so that the carrier frequency can be prevented from being shifted. Feedback of the PLL is restarted immediately after completion of the modulation, thereby enabling an accurate oscillating operation to be performed again at a desired frequency.

Figure 3:
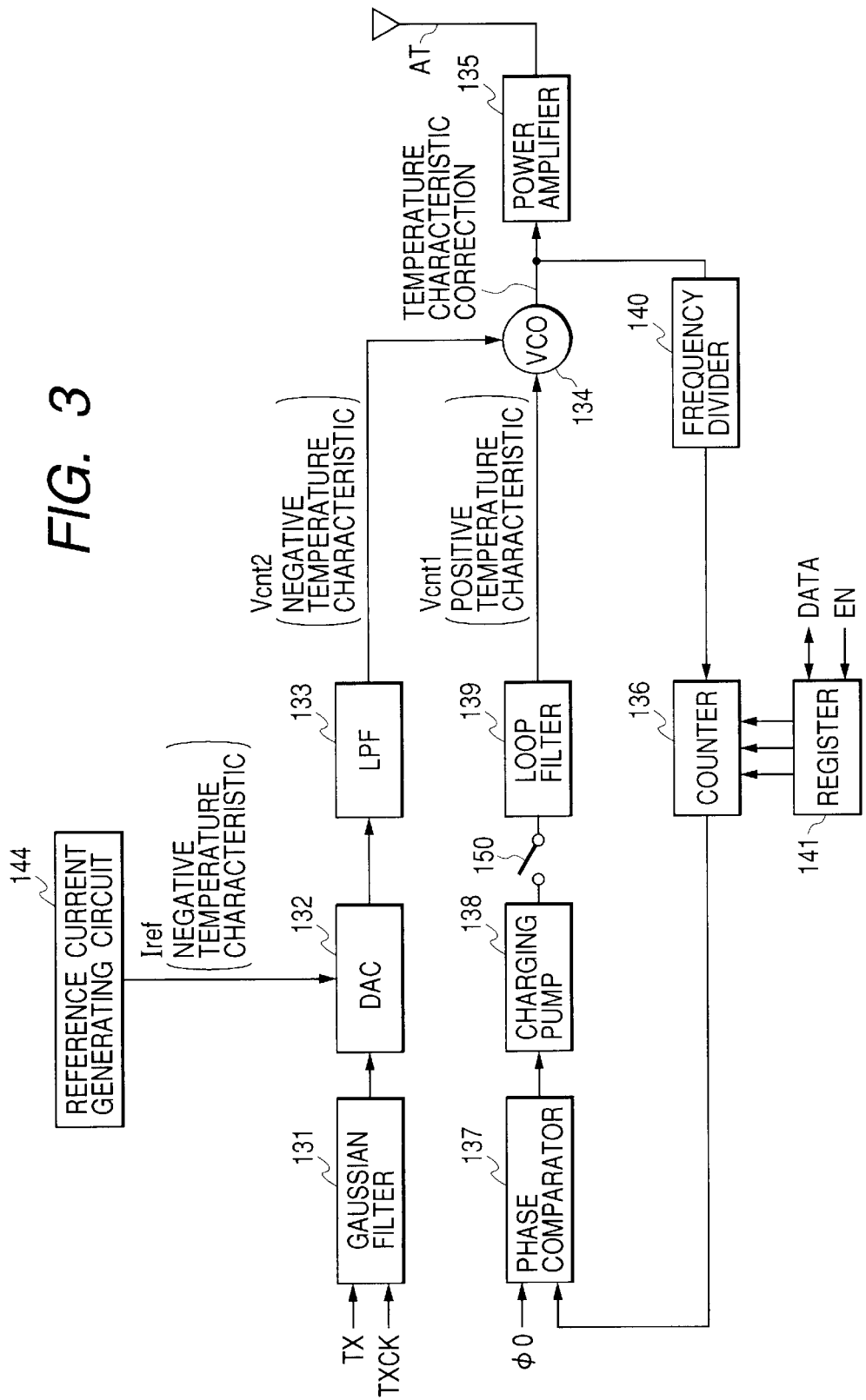
FIG. 3 is a block diagram showing a first example of a transmission circuit of the semiconductor integrated circuit for modulation according to the invention.

The mechanism of switching of the carrier frequency in the VCO 134 and temperature compensation of the reference current supplied to the DA converting circuit 132, which relates to the switching will now be described. FIG. 3 more specifically shows the configuration of the transmitting circuit 130 illustrated in FIG. 1. The same circuit blocks as those in FIG. 1 are designated by the same reference numerals.

Although not shown in FIG. 1, between the phase comparator 137 and the VCO 134, the charge pump 138 for generating a (positive or negative) voltage according to the phase difference detected by the phase comparator 136 and the loop filter 139 for smoothing an output of the charge pump 138 are provided. By a closed loop constructed by the VCO 134, counter 136 as a frequency divider, phase comparator 136, charge pump 138, and loop filter 139, a PLL circuit for performing feedback so that the phase of an output of the counter 136 and the phase of the reference clock φ0 coincide with each other and oscillating at a predetermined frequency is constructed. An oscillation signal generated by the PLL circuit of the closed loop serves as a carrier frequency. Between the charge pump 138 and the loop filter 139, a switch 150 capable of interrupting a current supplied from the charge pump 138 to the loop filter 139 is provided. By the switch 150, the PLL can be made an open loop.

Further, in the embodiment, accompanying the counter 136, a register 141 for shifting the carrier frequency in unit of 1 MHz or the like by changing the count value to be counted by the counter 136 by a setting from the baseband circuit 350 is provided. In the case of the Bluetooth standard, for example, the register 141 has at least 7 bits so that the frequency can be hopped to any of 79 channels set every MHz between 2.402 GHz to 2.480 GHz. The value of the register 141 can be rewritten directly by the baseband circuit 350 shown in FIG. 1.

In the embodiment, the register 141 is constructed so as to bidirectionally transmit data to/from the counter 136, and the count value of the counter 136 can be read from a not-shown external terminal to the outside of the chip via the register 141. Further, a frequency divider 140 for dividing an oscillation output of the VCO 134 to, for example, 1/64 is provided at an anterior stage of the counter 136. By providing the frequency divider 140, a circuit configuration of changing the count value of the counter 136 by the setting to the register 141 is made simpler. Further, a reference current generating circuit 144 for supplying a reference current to be made to flow to the DA converting circuit 132 is provided. In the embodiment, a reference current Iref generated by the reference current generating circuit 144 has a negative temperature characteristic.

The principle of temperature compensation in the transmitting circuit of the embodiment will be described first by referring to FIGS. 5A to 5C. Generally, in a high-precision DA converting circuit, a reference current generating circuit for generating a reference current necessary for a DA converting operation by using a circuit for generating a constant voltage having no temperature dependency like a band gap reference circuit is provided. Specifically, a reference current generating circuit for generating a reference current flowing to a normal DA converting circuit is so designed as not to have temperature dependency. In contrast, in the transmitting circuit of the embodiment, the reference current generating circuit 144 for generating the reference current supplied to the DA converting circuit is designed to have a negative temperature characteristic. Consequently, the rate of change of the control voltage Vcnt2 for modulation to be supplied to the VCO 134 via the low pass filter 133 has a negative temperature characteristic as shown in FIG. 5B. On the other hand, the voltage-frequency control sensitivity of the VCO 134 has a positive temperature characteristic as shown in FIG. 5A. Therefore, the rate of change in modulation frequency is designed so as not to have temperature dependency as shown in FIG. 5C.

Figure 6:
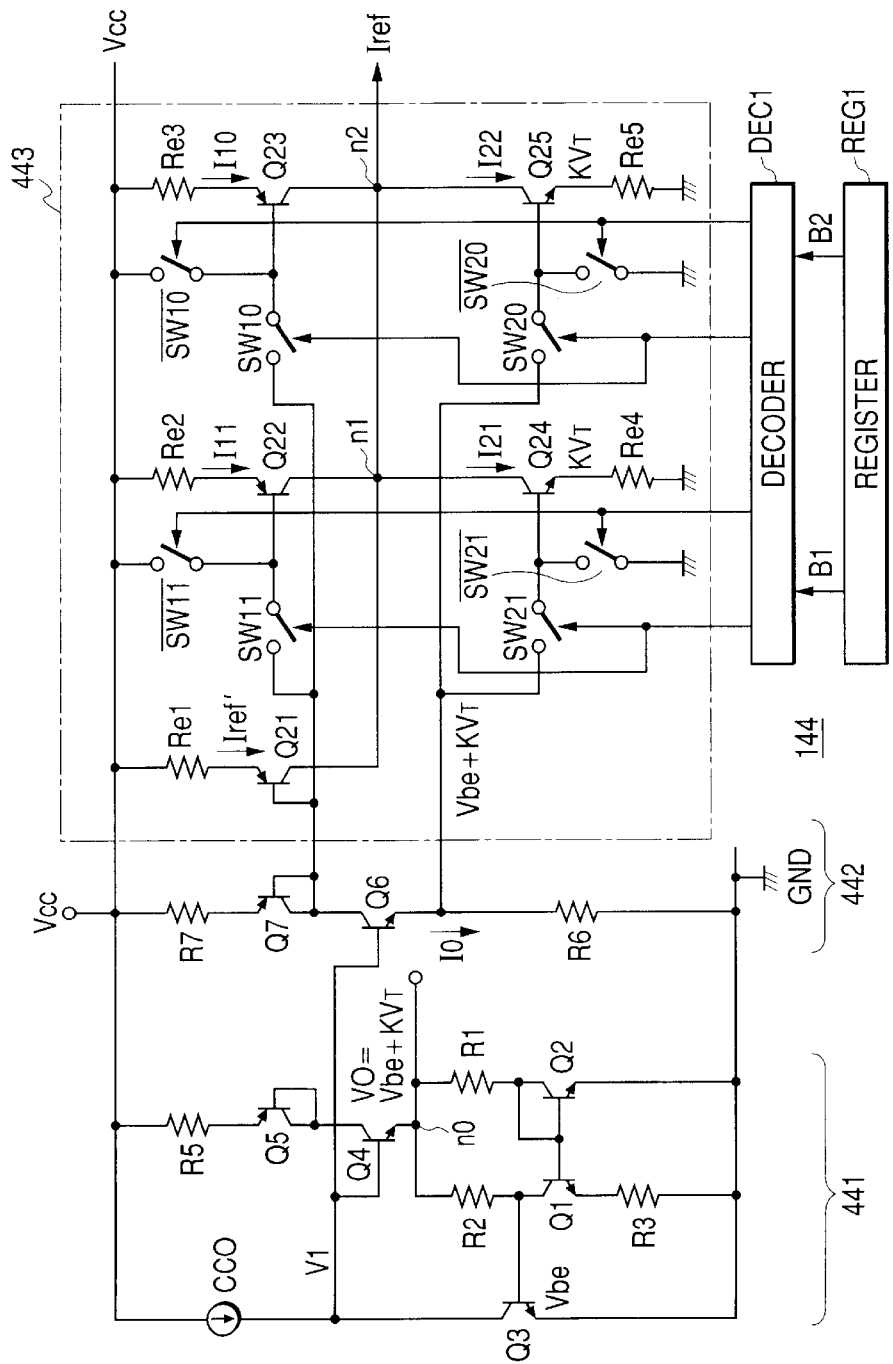
FIG. 6 is a circuit diagram showing a concrete circuit example of a reference current generating circuit capable of adjusting temperature characteristics.
Figure 7:
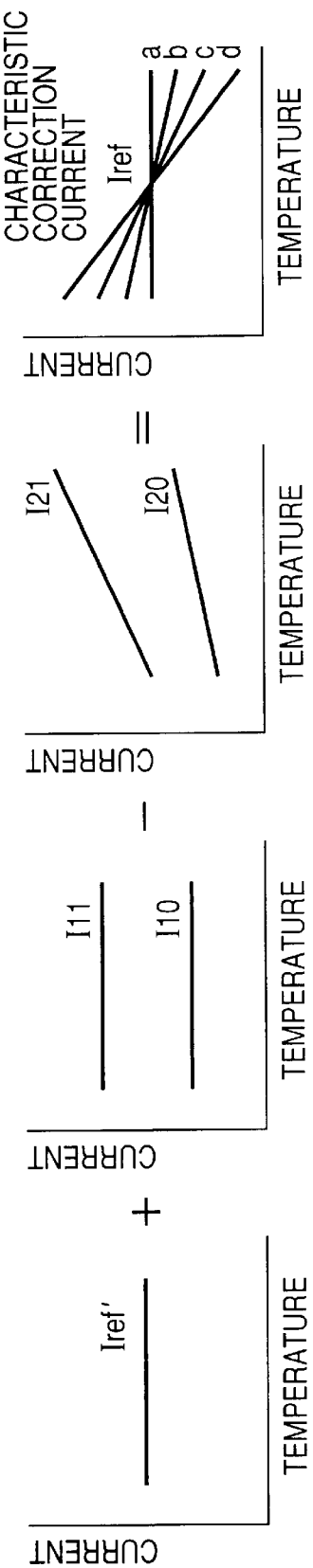
FIGS. 7A to 7D are graphs showing the principle of correction in a temperature characteristic correcting circuit.

FIG. 6 shows a concrete example of the reference current generating circuit 144 capable of adjusting the temperature characteristic.

The reference current generating circuit 144 of the embodiment has a constant voltage circuit 441, a voltage-current converting circuit 442, and a temperature characteristic correcting circuit 443 like a band gap reference circuit. The band gap reference circuit has bipolar transistors (hereinbelow, simply called transistors) Q1 and Q2 whose bases are commonly connected. The base and the collector of the transistor Q2 are coupled to each other, and the collector voltage of the transistor Q2 is applied to the bases of the transistors Q1 and Q2. The emitter of the transistor Q1 is connected to a ground point GND via a resistor R3, the emitter of the transistor Q2 is connected directly to the ground point GND, and the collectors of the transistors Q1 and Q2 are connected to each other via the resistors R1 and R2.

A constant current source (or resistor) CC0 and the transistor Q3 are connected in series between the power supply voltage Vcc such as 5 V and the ground point GND. The collector voltage of the transistor Q1 is applied to the base of the transistor Q3. A transistor Q4 whose base receives the collector voltage of the transistor Q3 is provided. The emitter of the transistor Q4 is connected to a connection node n0 of the resistors R1 and R2 and the collector current of the transistor Q4 is distributed to the transistors Q1 and Q2. A so-called diode-connected transistor Q5 whose base and collector are connected to each other and a resistor R5 are connected in series between the collector of the transistor Q4 and the power supply voltage Vcc.

The constant voltage circuit 441 of the embodiment is a known band gap reference circuit called a Widler type. When a base-emitter voltage of a bipolar transistor having a negative temperature characteristic of −2 mV/° C. is set as Vbe and temperature is set as T, a potential V0 of the connection node n0 is expressed by the following equation.

$$V0 = Vbe + (R2/R3) \cdot (kT/q) \cdot \ln(R2/R1)$$

$(R2/R3) \cdot (kT/q) \cdot \ln(R2/R1)$ in the second term will be expressed as KVT hereinbelow.

In the equation, the first term has the negative temperature characteristic. Since the second term includes the temperature T, it has a positive temperature characteristic. In the Widler type band gap reference circuit, therefore, by setting the values of resistors R1, R2, and R3 in the second term so as to cancel out the negative temperature characteristic of Vbe in the first term, even if the temperature changes, the potential V0 of the connection node n0 is made constant, that is, the potential does not have dependency on temperature.

The reference current generating circuit 144 of the embodiment is constructed so that a transistor Q6 for voltage-current conversion whose base receives a potential V1 which is the same as the base potential of the transistor Q4 in the band gap reference circuit is provided, and a current IO having no dependency on temperature is made to flow to the transistor Q6. A resistor R6 is connected between the emitter of the transistor Q6 and the ground point, and a diode-connected pnp transistor Q7 and a resistor R7 are connected in series between the collector of the transistor Q6 and the power supply voltage Vcc. Although the resistor R6 and the like has a positive temperature characteristic, by using a proper fabricating process, the change in temperature can be reduced to the degree that it can be ignored as compared with the temperature characteristic of the base-emitter voltage Vbe of the transistor. Therefore, the current IO flowing in the transistor Q6 can be a current having no dependency on temperature.

The temperature characteristic correcting circuit 443 has a pnp transistor Q21 which is connected to the pnp transistor Q7 so as to form a current mirror. Therefore, a current Iref' having no dependency on temperature is made to flow to the transistor Q21 in a manner similar to the transistor Q7. Further, the temperature characteristic correcting circuit 443 has pnp transistors Q22 and Q23 having bases to which the same voltage as the base voltage of the pnp transistor Q21 is applied via switches SW11 and SW10, respectively, and npn transistors Q24 and Q25 to which the emitter voltage of the npn transistor Q6 is applied to their bases via switches SW21 and SW20, respectively. The collectors of the transistors Q21 to Q25 are connected to the common node n1, and emitter resistors Re1 to Re5 are connected to the emitters of the transistors Q21 to Q25 between the emitters and the power supply voltage Vcc or the ground point. Therefore, in a manner similar to the transistor Q11, the collector current having no dependency on temperature is made to flow to the transistors Q21 to Q23 out of the transistors Q21 to Q25.

On the other hand, the same voltage as the base voltage of the transistor Q4 is applied to the base of the transistor Q6, so that the emitter voltage of the transistor Q6 becomes the same as the potential V0 (=Vbe+KVT) of the node n0. The voltage Vbe+KVT having no dependency on temperature is consequently applied to the bases of the transistors Q24 and Q25, and the potential of the emitter of each of the transistors Q24 and Q25 is set to a potential KVT which is lower than the base potential only by Vbe. Therefore, currents I21 and I20 proportional to KVT having the positive temperature characteristic are made to flow to the resistors Re4 and Re5.

Further, the temperature characteristic correcting circuit 443 of the embodiment is designed so that, by properly setting the resistance ratio of the emitter resistors Re1 to Re5, when the collector current Iref is made to flow to the transistor Q21 is 100, the collector currents I11 and I10 at the ratio of 10 and 5 are made to flow to the transistors Q22 and Q23, respectively, and the same collector currents I21 and I20 as those of the transistors Q22 and Q23 are made to flow to transistors Q24 and Q25, respectively, at room temperature (for example, 25° C.). Switches /SW11 and /SW10 which are turned on and off complementarily to the switches SW11 and SW10 are provided between the bases of the transistors Q22 and Q23 and the power supply voltage Vcc. Switches /SW21 and /SW20 which are turned on/off complementarily to the switches SW21 and SW20 are provided between the bases of transistors Q24 and Q25 and the ground point.

In the embodiment, by signals obtained by decoding control data B1 and B2 set in a register REG1 by a decoder DEC1, the switches SW11 to SW20 are turned on/off as shown in the following table 1. The control data B1 and B2 to the register REG1 can be set, for example, by the baseband circuit 350 when the system is initialized on the basis of preliminarily measured results. It is also possible to input a signal at a desired level to the decoder DEC1 by using a nonvolatile device or a fuse in place of the register REG1 so that the on/off state of each of the switches SW11 to SW20 is set in a desired state.

TABLE 1

| B1, B2 | SW11, SW10 | SW21, SW20 | Transistors to be turned on | correspondence to FIGS. 7A to 7D |
|---|---|---|---|---|
| 00 | off | off | | a |
| 01 | off | on | Q23, Q25 | b |

TABLE 1-continued

| B1, B2 | SW11, SW10 | SW21, SW20 | Transistors to be turned on | correspondence to FIGS. 7A to 7D |
|---|---|---|---|---|
| 10 | on | off | Q22, Q24 | c |
| 11 | on | on | Q22 to Q25 | d |

FIGS. 7A to 7D show the principle of correction in the temperature characteristic correcting circuit 443 and the characteristic of the composite reference current Iref output from the reference current generating circuit 144 in the case where the switches SW11 to SW20 are set in the on/off state as shown in Table 1. As shown in FIGS. 7A to 7D, the temperature characteristic correcting circuit 443 of the embodiment changes the temperature characteristic of the composite current Iref by adding the collector current I11 or I10 of the transistor Q22 or Q23 to the collector current Iref' flowing in the transistor Q21 and, further, subtracting the collector current I21 or I20 of the transistor Q24 or Q25.

Concretely, in a state where the control data B1 and B2 is set to "00" and all of the switches SW11 to SW20 are turned off, the composite current is only the collector current Iref' of the transistor Q21. Consequently, the reference current to be output has a characteristic as expressed by the line "a" in FIG. 7D having no dependency on temperature. On the other hand, when the control data B1 and B2 is set to "0, 1" and the switches /SW11 and SW10 are turned on and the switches /SW21 and SW20 are turned on, the composite current is a current (Iref'+I10−I20) obtained by adding the collector current I10 of the transistor Q23 to the collector current Iref' of the transistor Q21 and, further, subtracting the collector current I20 of the transistor Q25. Consequently, the reference current Iref to be output has a slightly negative temperature characteristic as expressed by the line "b" in FIG. 7D.

In a state where the control data B1 and B2 is set to "1, 0", the switches SW11 and /SW10 are turned on, and the switches SW21 and /SW20 are turned on, the combined current is a current (Iref'+I11−I21) obtained by adding the collector current I11 of the transistor Q22 to the collector current Iref' of the transistor Q21 and, further, subtracting the collector current I21 of the transistor Q24, so that the reference current Iref to be output has a intermediate negative characteristic as shown by the line "c" in FIG. 7D. When the control data B1 and B2 is set to "1, 1" and the switches SW11, SW10, SW21 and SW20 are turned on, the composite current is a current (Iref'+I11+I10−I21−I20) obtained by adding the collector currents I11 and I10 of the transistors Q22 and Q23 to the collector current Iref' of the transistor Q21 and, further, subtracting the collector currents I21 and I20 of the transistors Q24 and Q25. Consequently, the reference current Iref to be output has a largest negative temperature characteristic as expressed by the line "d" in FIG. 7D.

Therefore, it is sufficient to measure a shift of a modulation frequency in accordance with the (positive) temperature characteristic of the VCO 134 and determine the control codes B1 and B2 to be set in the register REG1 so as to select the reference current Iref optimum to cancel out the temperature characteristic. In the foregoing embodiment, the temperature characteristic correcting circuit 443 is provided with two sets of transistors for adding and subtracting currents which can be selected by a switch to thereby switch the temperature characteristic of the reference current Iref to be output in four stages has been described. It is also possible to increase the number of transistors for adding and subtracting currents to thereby increase the number of stages of the temperature characteristic which can be switched.

Figure 8:
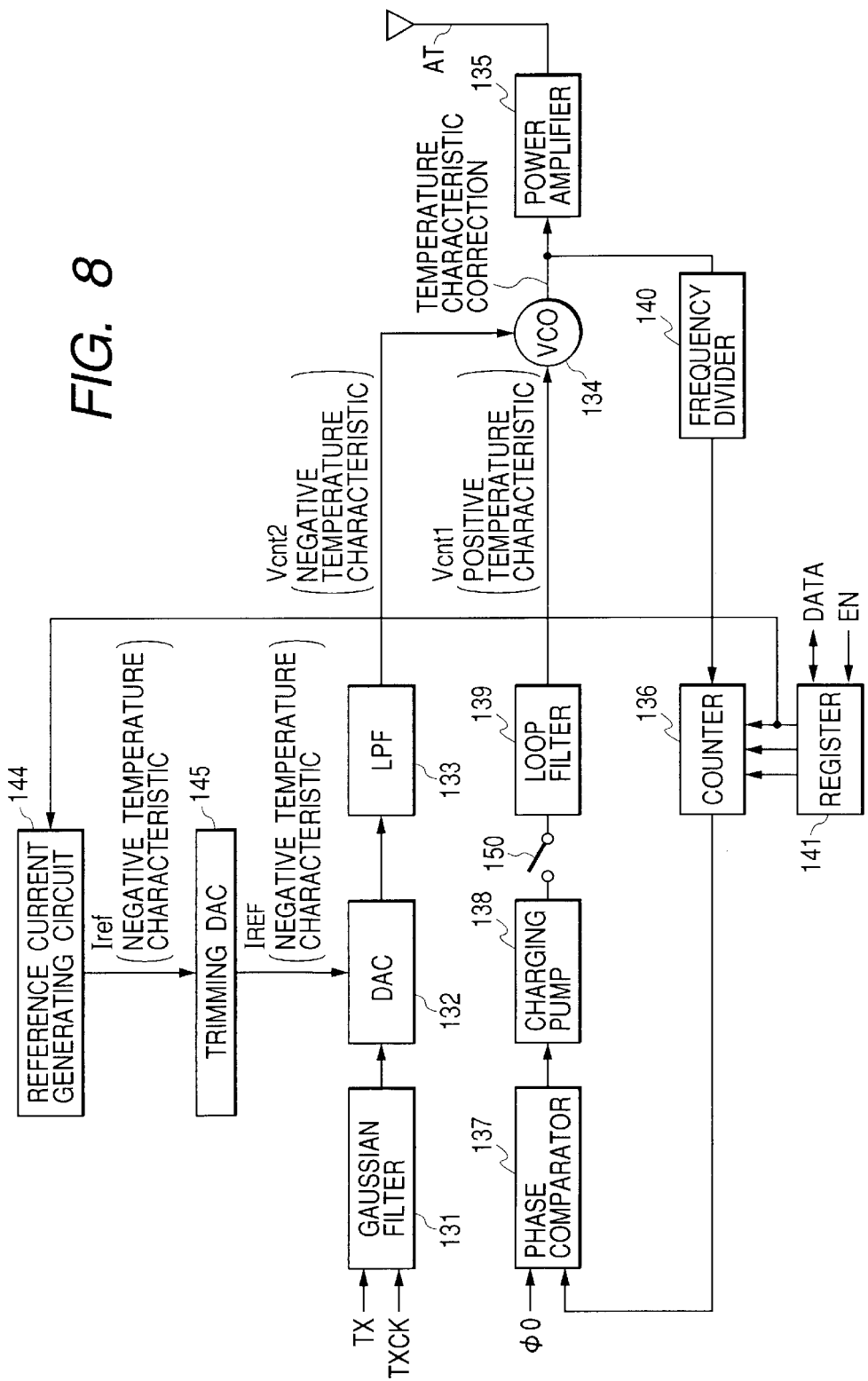
FIG. 8 is a block diagram showing a second example of a transmission circuit of a semiconductor integrated circuit for modulation according to the invention.

A second embodiment of the invention will now be described with reference to FIG. 8.

In the second embodiment, a trimming circuit for adjusting modulation frequency of the LC oscillation type VCO 134 is provided. The LC oscillation type VCO uses a capacitative element. The capacitative element has large manufacture variations of the capacitance value and the oscillation frequency of the VCO largely fluctuates due to the variations in capacitance, so that a trimming circuit is generally provided to correct the variations in the oscillation frequency. In the embodiment, as a trimming circuit, a DA converting circuit 145 for trimming which adjust the reference current IREF to be supplied to the DA converting circuit 132 in accordance with the value set in the register is provided. In addition, by performing temperature correction on the reference current Iref of the DA converting circuit 145 for trimming by the reference current generating circuit 144 of the embodiment, the modulation frequency of the VCO is prevented from being fluctuated by the temperature change.

Figure 4A:
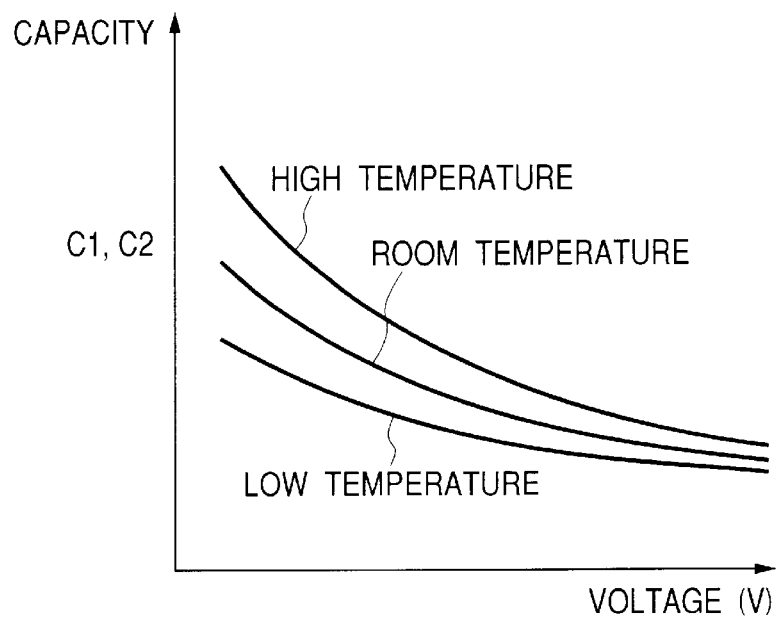
FIGS. 4A and 4B are graphs showing temperature characteristics of capacitative elements in an LC oscillation type VCO for use in the semiconductor integrated circuit for modulation according to the invention and the oscillation frequency of the VCO.
Figure 4B:
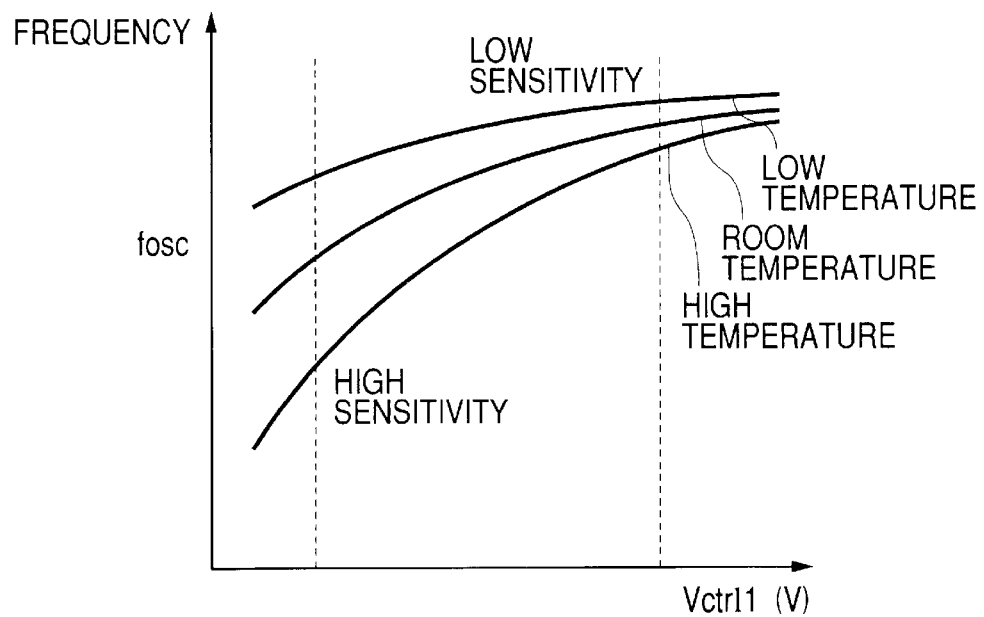

Further, in the embodiment, in a semiconductor integrated circuit for modulation used for a system performing frequency hopping, when the carrier frequency is switched to perform frequency hopping, as understood also from FIG. 4B, the voltage-frequency control sensitivity largely varies. Consequently, when the set value of the register 141 is rewritten to switch the carrier frequency, the correction current characteristic (refer to FIG. 7) in the temperature characteristic correcting circuit 443 in the reference current generating circuit 144 is switched accordingly. Therefore, in the reference current generating circuit 144 applied in the embodiment, the register 141 shown in FIG. 8 corresponds to the register REG1 shown in FIG. 6.

Concretely, when the carrier frequency is high, the correction current characteristic is switched to, for example, the characteristic with a small gradient like the straight line "b" in FIG. 7B. When the carrier frequency is high, the correction current characteristic is switched to, for example, the characteristic with a large gradient like the straight line "d" shown in FIG. 7D. The register 141 consists of 7 bits so as to have information to switch the carrier frequency in 79 stages whereas the reference current generating circuit 144 in FIG. 6 is constructed to switch the temperature characteristic of the reference current in four stages, so that it is preferable to switch the temperature characteristic of the reference current Iref in four stages by using, for example, a code of upper two bits of the register 141. The invention is not limited to the temperature characteristic of the reference current Iref which is switched in four stages but it is also possible to increase the number of current transistors for addition/subtraction of the temperature characteristic correcting circuit 443 in the reference current generating circuit 144 to thereby switch the temperature characteristic in the larger number of stages.

Figure 9:
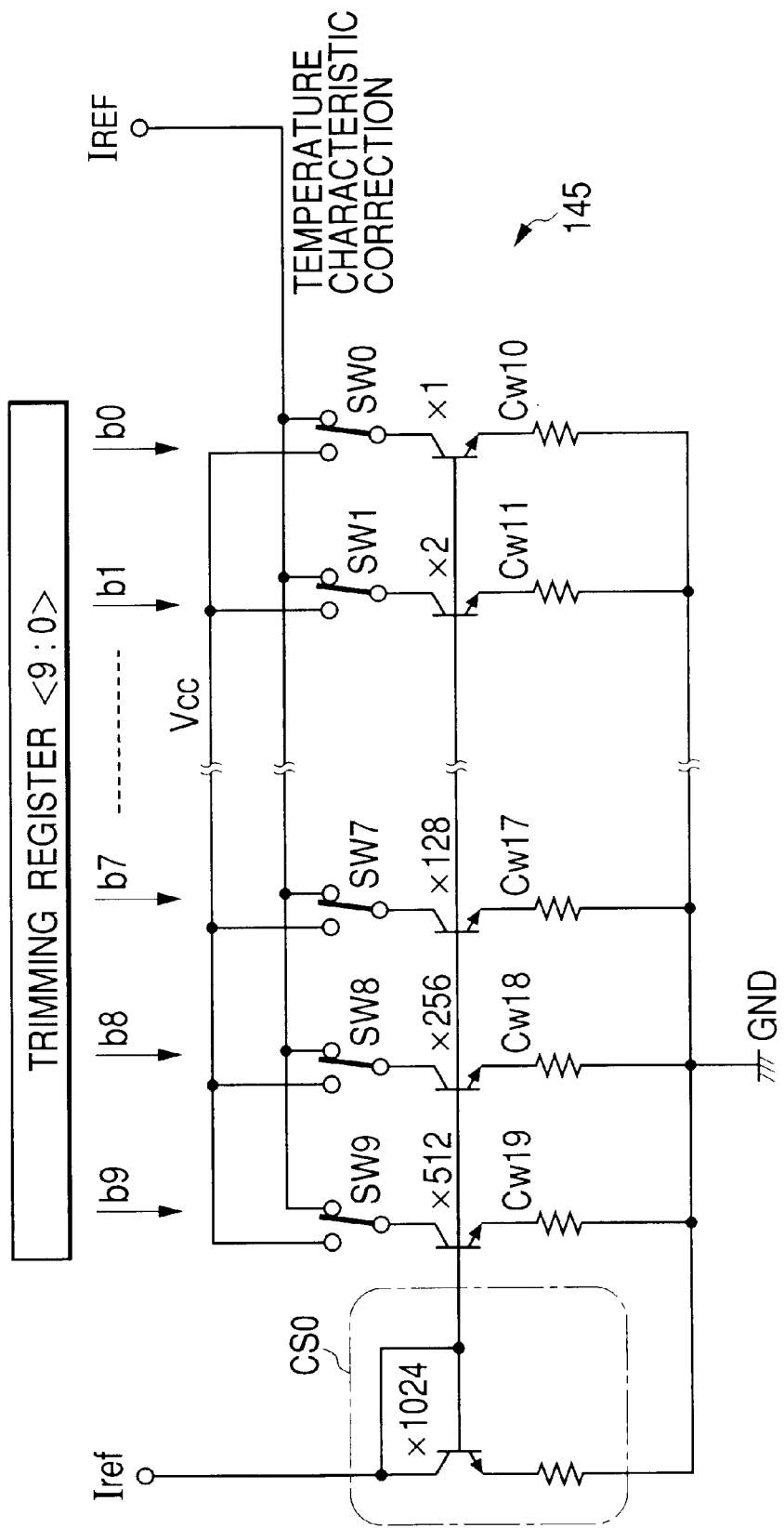
FIG. 9 is a circuit diagram showing a concrete circuit example of a trimming circuit.

FIG. 9 shows an example of the DA converting circuit 145 for trimming. The DA converting circuit 145 of the embodiment is constructed by a reference current source CS0 for making flow the reference current Iref supplied from the reference current generating circuit 144 shown in FIG. 6, weighted current sources Cw10 to Cw19 which are connected to diode-connected transistors constructing the reference current source CS0 so as to form a current mirror and make flow currents of $1/1024$, $1/512$, ..., $1/8$, $1/4$, and $1/2$ of the reference current Iref, and change-over switches SW10 to SW19 connected in series to the weighted current sources Cw10 to Cw19, respectively. The other terminal of each of the switches SW10 to SW19 is connected to the ground point, and the currents of the weighted current sources Cw10 to Cw19 are made to flow from either the current output terminal Iout or the power supply voltage terminal Vcc by the switches SW10 to SW19.

In the DA converting circuit 145 for trimming, when the switches SW0 to SW9 are switched by outputs b9 to b0 of the trimming register REG2, the current IREF obtained by combining the currents flowing in the switches switched to the current output terminal Iout side is output (to be accurate, the current IREF is pulled out from the DA converting circuit 132). In place of the trimming register REG2, a program element such as a fuse device or nonvolatile memory device, a pad for applying a voltage by making a probe comes into contact, and the like can be used.

Figure 10:
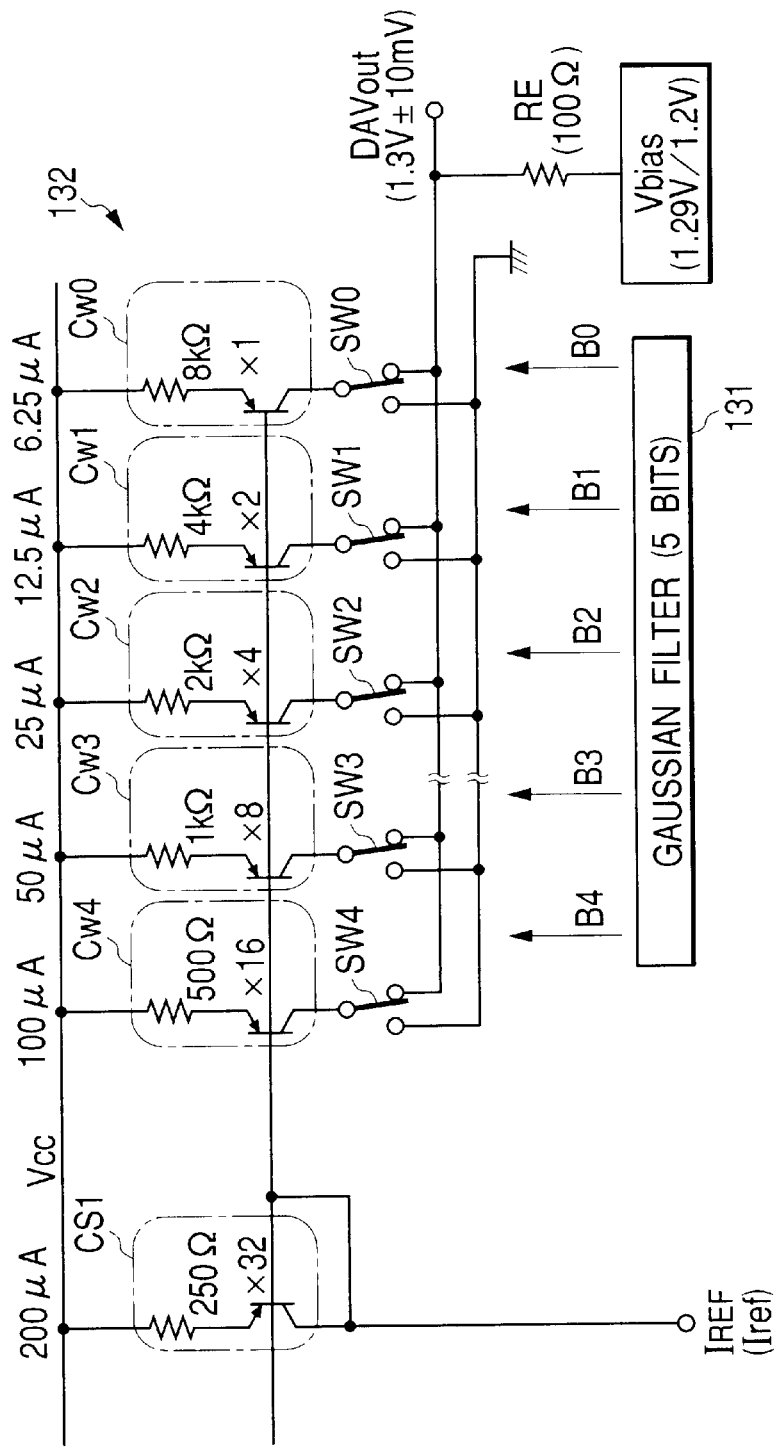
FIG. 10 is a circuit diagram showing an example of a DA converting circuit for DA converting a digital transmission data signal used in the semiconductor integrated circuit for modulation according to the invention.

FIG. 10 shows an example of the DA converting circuit 132. The DA converting circuit of the embodiment is constructed by the reference current source CS0 for making flow the reference current Iref supplied from the DA converting circuit 145 for trimming having the configuration as shown in FIG. 9 (the reference current Iref supplied from the reference current generating circuit 144 in the case of the first embodiment which does not use the DA converting circuit 145 for trimming), a current source CS1 connected to the reference current source CS0 in series, weighted current sources Cw0 to Cw4 which are connected to the current source CS1 so as to form current mirrors and make currents of $1/32$, $1/16$, $1/8$, $1/4$, and $1/2$ of the reference current Iref flow, respectively, change-over switches SW0 to SW4 connected to the weighted current sources Cw0 to Cw4, respectively, in series, and a resistor Re for current-voltage conversion connected to a common connection terminal side of the switches SW0 to SW4. The other terminal of each of the switches SW0 to SW4 is connected to the ground point, and the currents of the weighted current sources Cw0 to Cw4 are made to flow to either the resistor Re for current-voltage conversion or the ground point by the switches SW0 to SW4.

In the DA converting circuit 132, when the switches SW0 to SW4 are switched by outputs B4 to B0 of the Gaussian filter 131, the current obtained by combining the currents flowing in the switches switched to the resistor side is made to flow to the resistor Re and converted to a voltage, and a voltage DAVout in any of $2^5$ stages, that is, 32 stages is output in accordance with the outputs B4 to B0 of the Gaussian filter 131.

Figure 11:
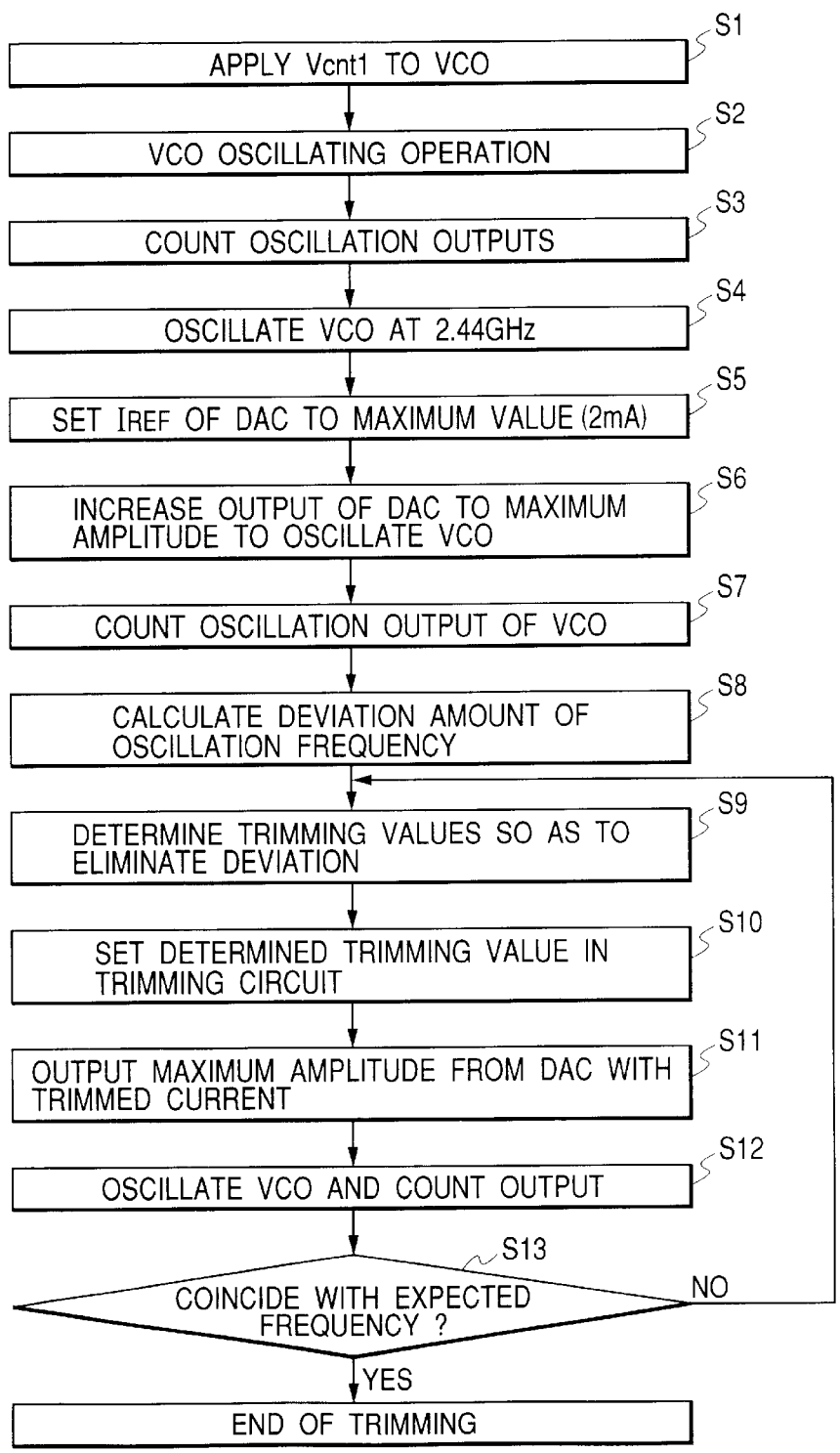
FIG. 11 is a flowchart showing an example of the procedure of adjusting a reference current of a DA converting circuit by using the trimming circuit.

The procedure of adjusting the reference current IREF of the DA converting circuit 132 by using the trimming circuit (145) will now be described by referring to FIG. 11.

First, the control voltage Vcnt1 of a proper magnitude is applied to the VCO 134 to make the VCO 134 perform an oscillating operation (steps S1 and S2). Next, an enable signal EN is supplied to the register 141 to make the oscillation output of the VCO 134 counted by the counter 136 only for predetermined time, and the count value is read via the register 141, thereby knowing the oscillation frequency of the VCO 134 (step S3). The value of the control voltage Vcnt1 is changed so that the VCO 134 operates at 2.44 GHz and performs the oscillating operation (step S4). The oscillation output at this time is also made counted by the counter 136 only for predetermined time and the count value is stored.

After that, the trimming circuit (145) is controlled to set the reference current IREF of the DA converting circuit 132 to the maximum value (2 mA) (step S5). The maximum output amplitude (100 mV) of the DA converting circuit 132 is applied to the modulation-side control terminal (Vcnt2) of the VCO 134 to make the VCO 134 perform the oscillating operation (step S6). The control voltage Vcnt1 at this time is the same as the voltage used when the VCO 134 is oscillated at 2.44 GHz. Subsequently, the oscillation output of the VCO 134 in this oscillation state is counted by the counter 136, and the difference between the count value and the count value obtained in step S4 is calculated to obtain modulation frequency. On the basis of the modulation frequency, a deviation amount from the expected oscillation frequency (1600 kHz) is calculated, and the trimming value is determined so as to eliminate the deviation (steps S7 to S9).

After that, the determined trimming value is set in the trimming register of the trimming circuit (145), the DA converting circuit 132 is operated with the trimmed current value, and the control voltage Vcnt2 at the same level as that in the normal operation is applied from the DA converting circuit to the VCO 134 to make the VCO 134 oscillate (steps S10 and S11). The oscillation output of the VCO 134 in this oscillation state is counted by the counter 136, the different between the count value and the count value obtained in step S34 is calculated to obtain the modulation frequency, and whether the modulation frequency coincides with the expected oscillation frequency (160 kHz) or not is checked (steps S12 and S13). If YES, the trimming is finished. If NO, the program returns to step S9 where the trimming value is determined again and reset.

Figure 12:
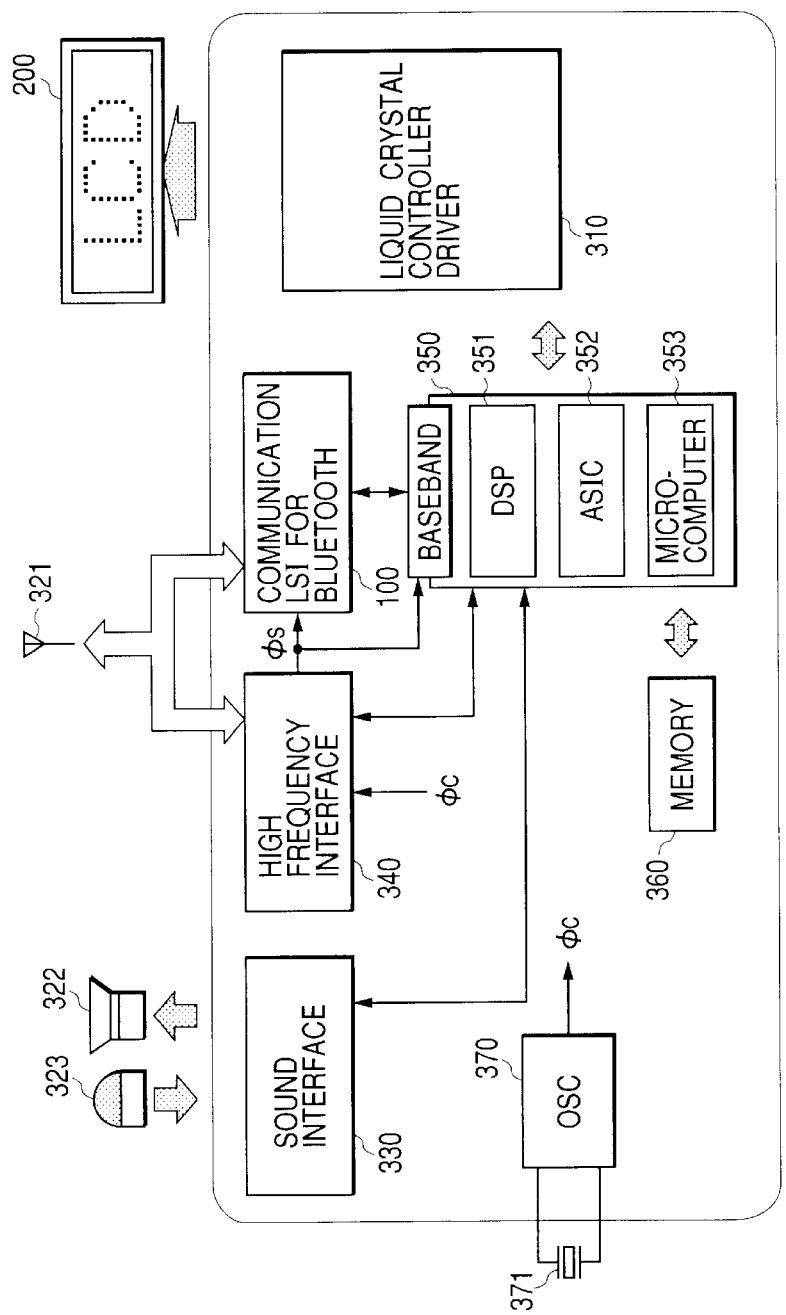
FIG. 12 is a block diagram showing the general configuration of a portable telephone to which an LSI for radio communication of the embodiment is applied.
Figure 13:
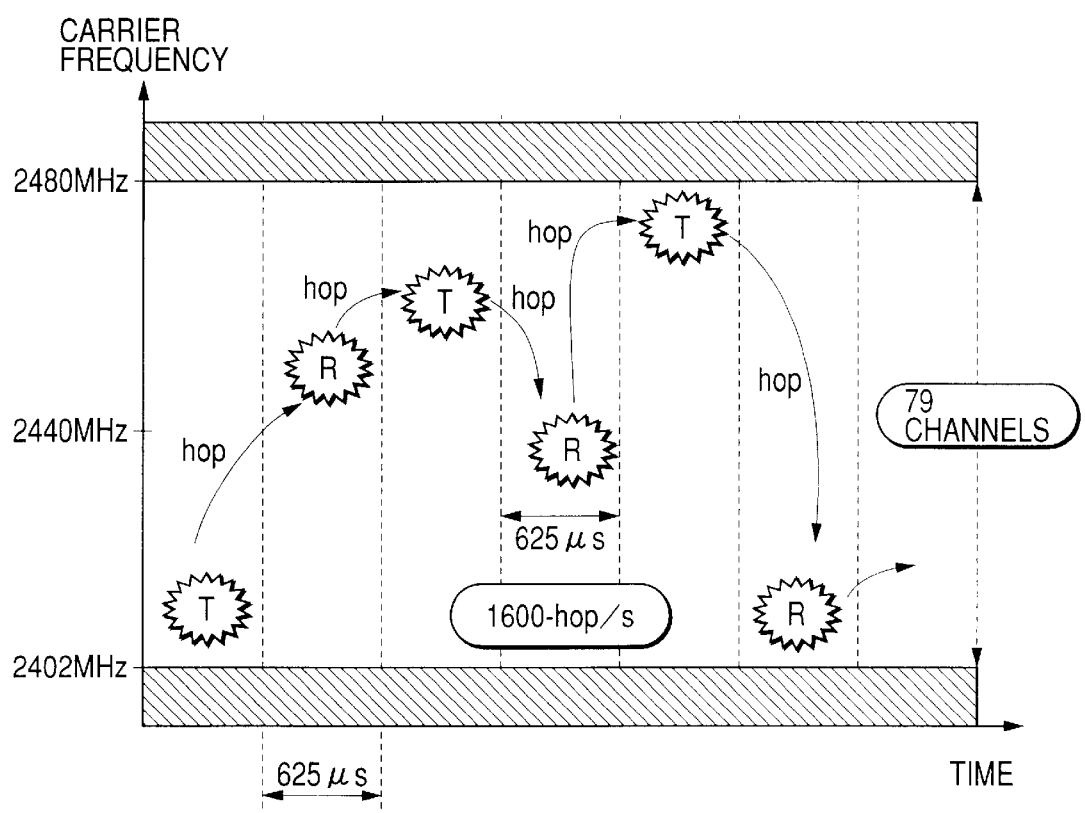
FIG. 13 is a conceptual diagram showing a state of frequency hopping in radio communication of the Bluetooth standard to which the invention is effectively applied.

FIG. 12 is a block diagram showing the general configuration of a portable telephone to which an LSI for radio communication in the foregoing embodiment is applied.

The portable telephone of the embodiment has a liquid crystal panel 200 as a display, an antenna 321 for transmission/reception, a speaker 322 for sound output, a microphone 323 for sound input, a liquid crystal control driver 310 for driving the liquid crystal panel 200 to display data, a sound interface 330 for inputting/outputting a signal from/to the speaker 322 and the microphone 323, a high frequency interface 340 for performing portable telephone communication in the GSM system via the antenna 321, an LSI 100 for radio communication which performs communication in conformity with the Bluetooth standard via the antenna 321 and to which the present invention is applied, a DSP (Digital Signal Processor) 351 for performing a signal process on a sound signal and transmission/reception signals, ASIC (Application Specific Integrated Circuits) 352 for providing a custom function (user logic), a system controller 353 taking the form of a microprocessor or microcomputer which performs controls on the whole system including the display control, a memory 360 for storing data and a program, and an oscillating circuit (OSC) 370.

By the DSP 351, ASIC 352, and microcomputer 353 as a system controller, the so-called baseband circuit 350 is constructed. Although only one baseband circuit 350 is shown in the drawing, a baseband circuit for a high-frequency interface 340 and a baseband circuit for the LSI 100 for radio communication in the Bluetooth standard may be separately provided. In FIG. 12, 371 denotes an oscillator such as a quartz resonator, and the oscillation circuit 370 generates a clock of a frequency such as 26 MHz.

Although the portable telephone system of the embodiment has the high-frequency interface 340 for performing portable telephone communication in the GSM system and the LSI 100 for radio communication of the embodiment for performing communication in the Bluetooth standard, there is a portable telephone communication system of the current GSM system using a system clock of 26 MHz as an operation clock of the LSI for high frequencies, and supplying a clock of 13 MHz obtained by dividing the system clock to the baseband circuit. On the other hand, the LCI 100 for radio communication of the embodiment which performs communication in the Bluetooth standard also uses the clock of 13 MHz as described above.

Consequently, the system clock $\phi s$ generated by the common oscillating circuit (OSC) 370 is supplied to the high-frequency interface 340, and the clock $\phi s$ of 13 MHz supplied from the high-frequency interface 340 to the baseband circuit 350 can be supplied also to the LSI 100 for radio communication of the embodiment of the Bluetooth standard to perform an operation. Alternately, a clock of 26 MHz generated by the oscillating circuit 370 is supplied to the high-frequency interface 340 of the GSM. On the other hand, the clock of 13 MHz obtained by dividing the clock of 26 MHz can be supplied to both the baseband circuit 350 and the LSI 100 for radio communication in the Bluetooth standard to perform an operation.

It is therefore unnecessary to provide another oscillating circuit for Bluetooth. Even if an LSI for performing radio communication in the Bluetooth standard is added to an existing portable telephone, an additional amount of hardware associated with the addition can be reduced extremely. By mounting the LSI 100 for radio communication in the Bluetooth standard, various functions can be provided such that a portable telephone can be used as a transceiver, data received by a portable telephone is output from a printer, and image data and sound data is transmitted from a personal computer to a portable telephone.

By mounting the high-frequency interface 340 and the LSI 100 for radio communication of the embodiment in the Bluetooth standard onto a notebook-sized personal computer, a hand-held PC, a palm PC, or the like, the function of transmitting data to a personal computer or a peripheral device of the Bluetooth standard and the function capable of connecting to the Internet can be provided.

Although the invention achieved by the inventors herein has been described concretely on the basis of the embodiments, obviously, the invention is not limited to the foregoing embodiments but can be variously modified without departing from the gist. For example, in the embodiments, a VCO used in a digital data transmission system for frequency modulating data and transmitting the resultant has been described. The invention can be generally applied to a VCO having two control terminals and whose oscillation frequency is controlled by control voltages from the control terminals. Although a DA converting circuit of 5 bits is used in the embodiment, obviously, the number of bits is not limited to five bits. The invention is not limited to a DA converting circuit using a weighted current but may use a DA converting circuit of another type.

Although the case where the voltage controlled oscillating circuit has a positive temperature characteristic has been described in the foregoing embodiment, when the oscillating circuit has a negative temperature characteristic, it is sufficient to give a positive temperature characteristic to the control voltage Vcnt2 supplied to the oscillating circuit by the temperature characteristic correcting circuit. That is, it is sufficient to give a temperature characteristic inverse to that of the voltage controlled oscillating circuit to a control voltage which is supplied to the oscillating circuit. To give the positive temperature characteristic to the control voltage supplied to the voltage control circuit, for example, it is sufficient to make the temperature characteristic shown in FIG. 7C become a negative temperature characteristic.

Although the case where the invention achieved by the inventors herein is applied to a VCO used in a radio communication system in the field as the background of the invention has been mainly described above, the invention is not limited to the case but can be generally applied to a system having a VCO.

Effects produced by representative ones of the inventions disclosed in the application will be briefly described as follows.

Fluctuations in the modulation frequency of a VCO accompanying a temperature change in a semiconductor integrated circuit for modulation for use in a radio communication system of a frequency hopping method which performs modulation by controlling a VCO circuit in accordance with transmission data in an open loop by using an LC oscillation type VCO circuit can be reduced. Thus, the radio communication system of the frequency hopping method using the VCO can perform accurate data transmission with little interference.

What is claimed is:

1. A semiconductor integrated circuit comprising:
   a voltage controlled oscillator;
   a phase comparator for comparing a phase of an oscillation output of the voltage controlled oscillator with a phase of a reference clock signal; and
   a control voltage generating circuit for generating a voltage which eliminates a phase difference detected by the phase comparator and applying the voltage as a first control voltage to said voltage controlled oscillator,
   said voltage controlled oscillator, said phase comparator, and said control voltage generating circuit constructing a phase locked loop, said voltage controlled oscillator being controlled by said first control voltage to generate a frequency signal as a reference, and data transmission being performed while changing the frequency by controlling said voltage controlled oscillator with a second control voltage based on transmission data,
   wherein when a frequency modulating operation is performed with said second control voltage, said phase locked loop is set in an open state, and
   wherein a temperature characteristic correcting circuit is included, which gives a temperature characteristic inverse to a temperature characteristic of said voltage controlled oscillator to said second control voltage.

2. The semiconductor integrated circuit according to claim 1, wherein a variable counter for counting an oscillation output of said voltage controlled oscillator is provided in said phase locked loop and, by changing the count value of the variable counter, the frequency as the reference is changed.

3. The semiconductor integrated circuit according to claim 1,
   wherein the circuit for generating said second control voltage has a digital filter for sampling a digital transmission data signal and performing computation and a DA converter for DA converting an output of the digital filter, and
   wherein said temperature characteristic correcting circuit makes correction so that a reference current of said DA converter has a temperature characteristic inverse to the temperature characteristic of said voltage controlled oscillator.

4. The semiconductor integrated circuit according to claim 3, wherein said temperature characteristic correcting circuit can select and correct one of a plurality of different temperature characteristics of said reference current.

5. The semiconductor integrated circuit according to claim 4, wherein said temperature characteristic correcting circuit comprises a plurality of first current sources for passing a current having little dependency on temperature, a plurality of second current sources for passing a current having a positive or negative temperature characteristic, and selecting means for selecting one or more current sources from said plurality of first current sources and from said plurality of second current sources, and a composite current of the selected current sources can be output as said reference current.

6. The semiconductor integrated circuit according to claim 4, wherein said temperature characteristic correcting circuit has a first register capable of setting selection information for selecting and correcting one of a plurality of temperature characteristics which are different from each other of said reference current.

7. The semiconductor integrated circuit according to claim 4, further comprising a second register for setting a value which is counted by said variable counter, wherein by changing the set value of the second register, said reference frequency is changed, and intensity of said reference current is controlled according to the set value of said second register.

8. The semiconductor integrated circuit according to claim 2, further comprising a trimming circuit for adjusting the intensity of the reference current of said DA converter.

9. The semiconductor integrated circuit according to claim 8, wherein said trimming circuit is constructed by a second DA converter for DA converting trimming information and supplying, as a reference current, a current according to the trimming information to said DA converter, and
   wherein said temperature characteristic correcting circuit makes correction so that the reference current of said second DA converter has a temperature characteristic inverse to the temperature characteristic of said voltage controlled oscillator.

10. The semiconductor integrated circuit according to claim 1, wherein said voltage controlled oscillator has first and second variable capacitor means, a capacitance value of said first variable capacitor means is changed by said first control voltage, and a capacitance value of said second variable capacitor means is changed by said second control voltage, thereby changing an oscillation frequency.

11. The semiconductor integrated circuit according to claim 1, wherein said temperature characteristic correcting circuit gives a negative temperature characteristic to said second control voltage.

* * * * *